(12) United States Patent
Wiswesser et al.

(10) Patent No.: US 6,296,548 B1
(45) Date of Patent: Oct. 2, 2001

(54) METHOD AND APPARATUS FOR OPTICAL MONITORING IN CHEMICAL MECHANICAL POLISHING

(75) Inventors: Andreas Norbert Wiswesser, Freiberg (DE); Judon Tony Pan, Saratoga, CA (US); Boguslaw Swedek, San Jose, CA (US); Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/591,187

(22) Filed: Jun. 8, 2000

Related U.S. Application Data

(63) Continuation-in-part of application No. 09/184,767, filed on Nov. 12, 1998.
(60) Provisional application No. 60/139,015, filed on Jun. 14, 1999.

(51) Int. Cl.[7] ..................................... B24B 49/00
(52) U.S. Cl. .................. 451/8; 451/6; 451/288
(58) Field of Search ................. 451/5, 6, 8, 41, 451/287, 288

(56) References Cited

U.S. PATENT DOCUMENTS

| 5,081,796 | 1/1992 | Schultz . | |
|---|---|---|---|
| 5,413,941 | 5/1995 | Koos et al. . | |
| 5,433,651 | * 7/1995 | Lustig et al. | 451/6 |
| 5,605,760 | 2/1997 | Roberts . | |
| 5,640,242 | 6/1997 | O'Boyle et al. . | |
| 5,672,091 | 9/1997 | Takahashi et al. . | |
| 5,791,969 | 8/1998 | Lund . | |
| 5,838,447 | 11/1998 | Hiyama et al. . | |
| 5,872,633 | 2/1999 | Holzapfel et al. . | |
| 5,893,796 | 4/1999 | Birang et al. . | |
| 5,899,792 | * 5/1999 | Yagi | 451/6 |
| 5,949,927 | 9/1999 | Tang . | |
| 5,964,643 | 10/1999 | Birang et al. . | |
| 6,159,073 | * 12/2000 | Wiswesser et al. | 451/6 |

FOREIGN PATENT DOCUMENTS

| 0881040A2 | 12/1998 | (EP) . |
| 0881484A2 | 12/1998 | (EP) . |
| 3-234467 | 10/1991 | (JP) . |

* cited by examiner

Primary Examiner—Joseph J. Hail, III
Assistant Examiner—Dung Van Nguyen
(74) Attorney, Agent, or Firm—Fish & Richardson

(57) ABSTRACT

An apparatus, as well as a method, brings a surface of a substrate into contact with a polishing pad that has a window, causes relative motion between the substrate and the polishing pad, and directs a light beam through the window so that the motion of the polishing pad relative to the substrate causes the light beam to move in a path across the substrate. Light beam reflections from the substrate are detected, and used to determine polishing parameters, detect process repeatability, and qualify processes.

15 Claims, 13 Drawing Sheets

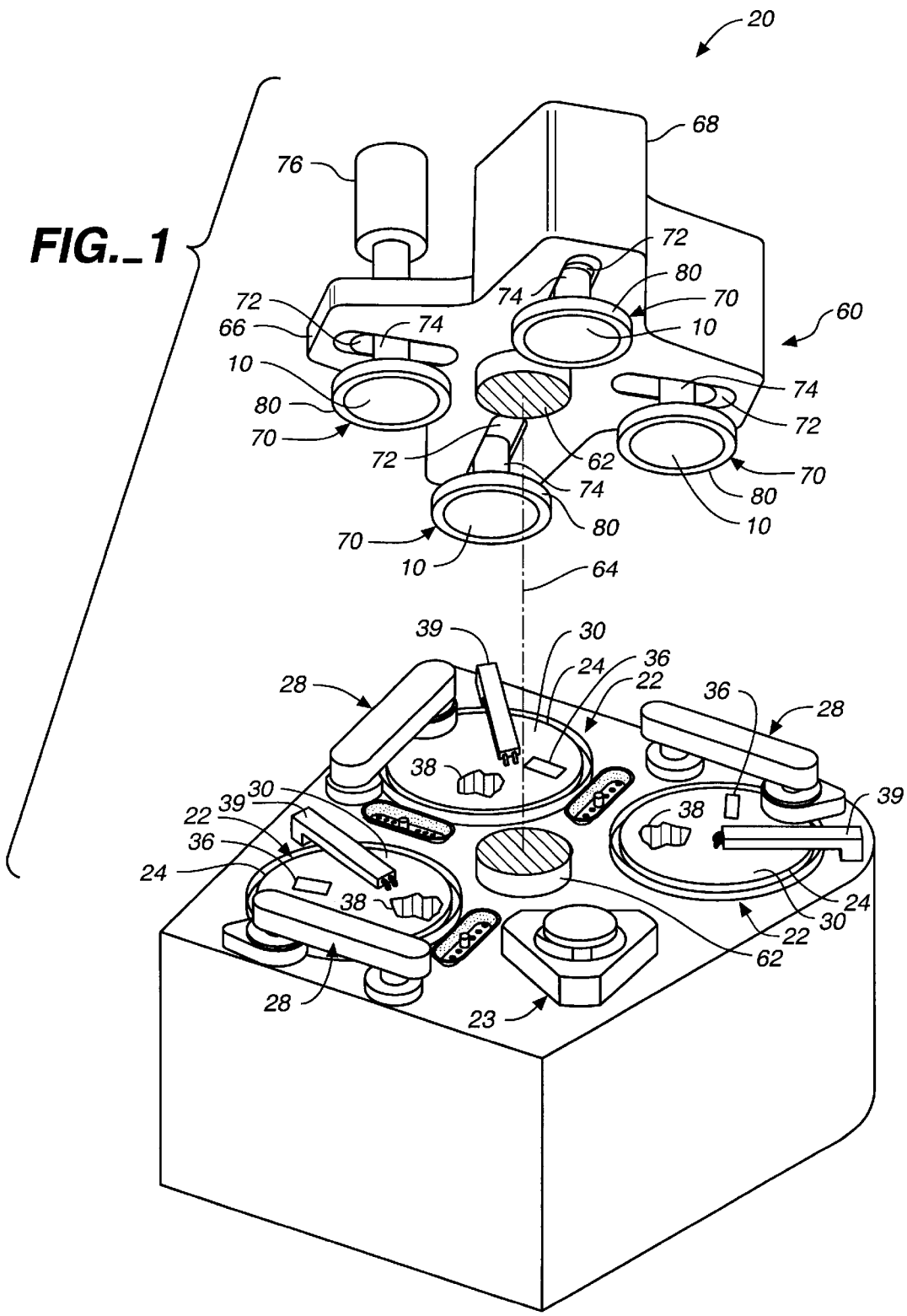

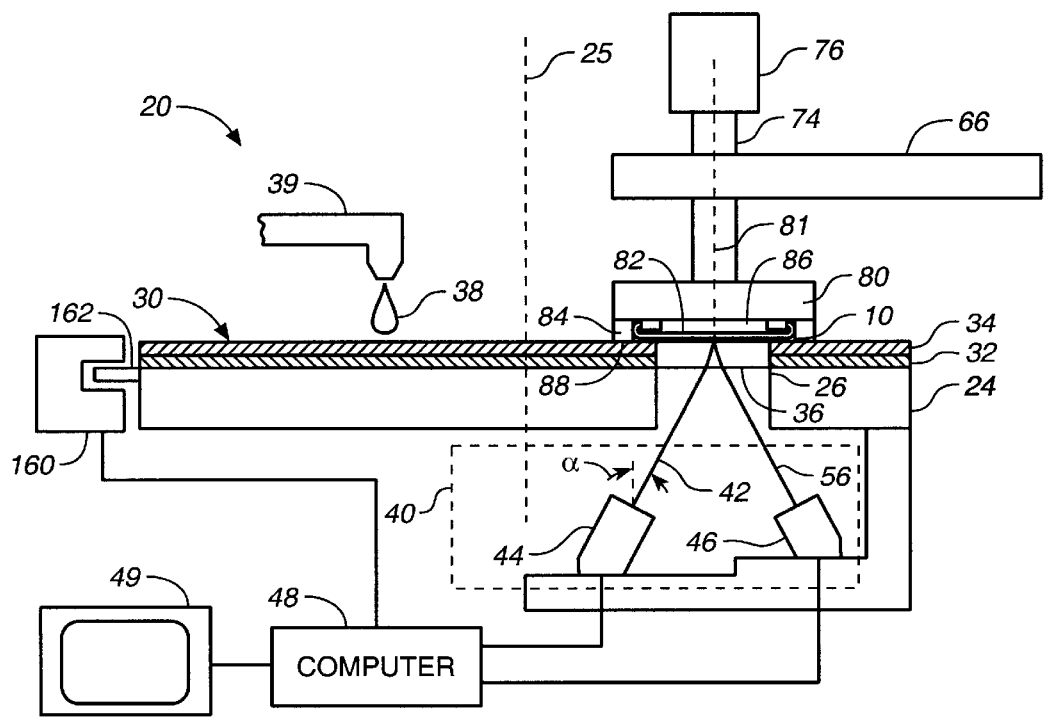
FIG._2
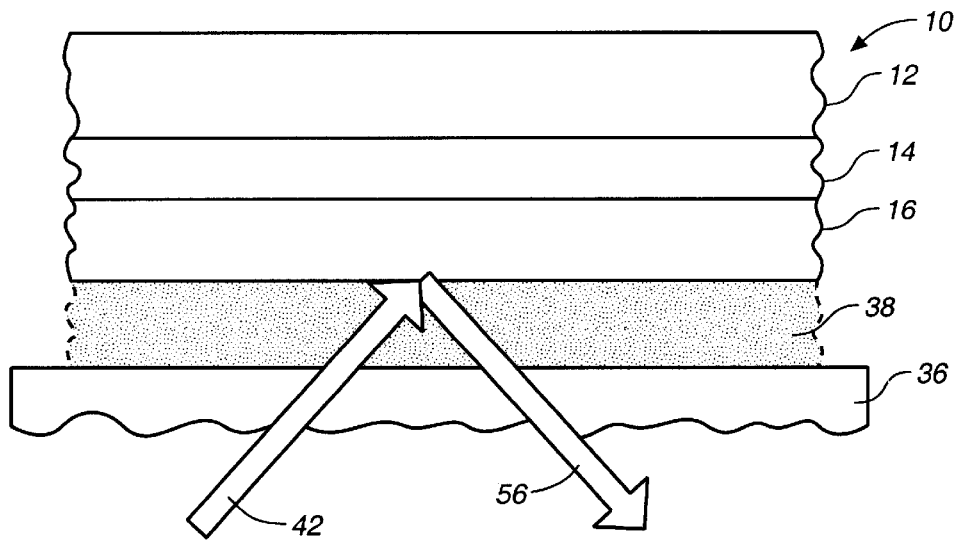
FIG._3

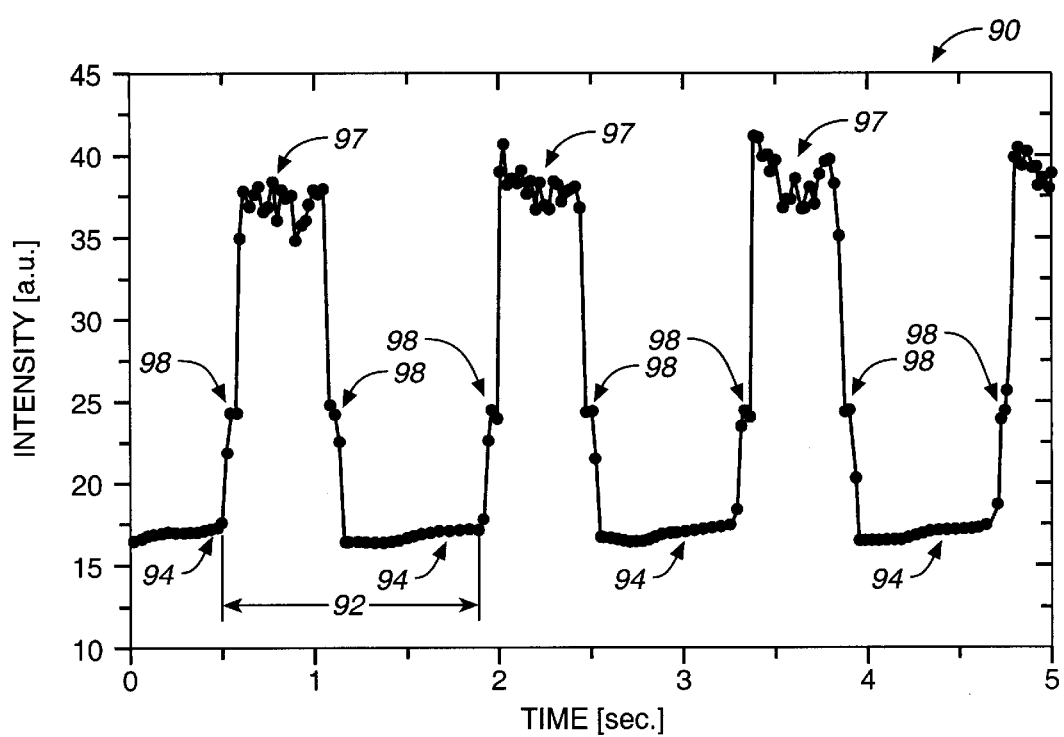
FIG._4

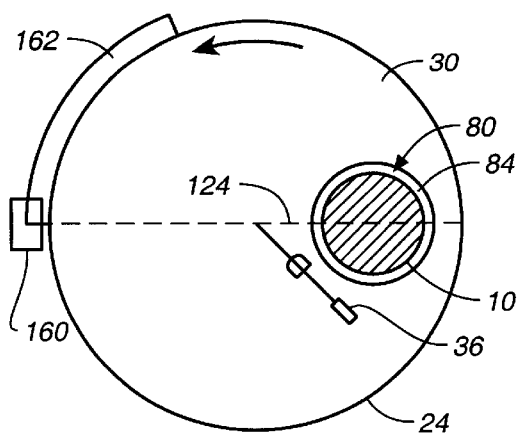
FIG._5A
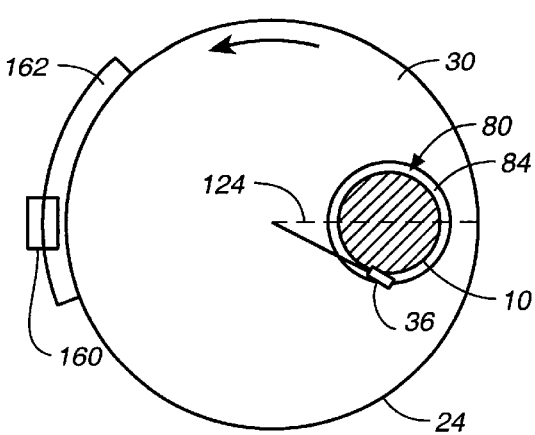
FIG._5B
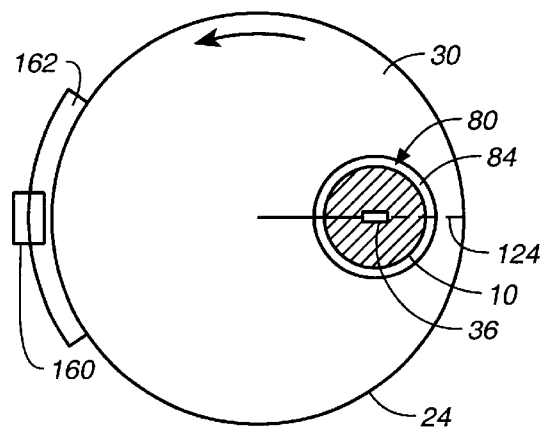
FIG._5C
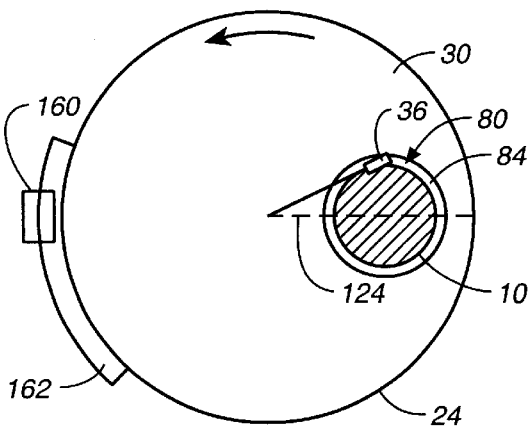
FIG._5D
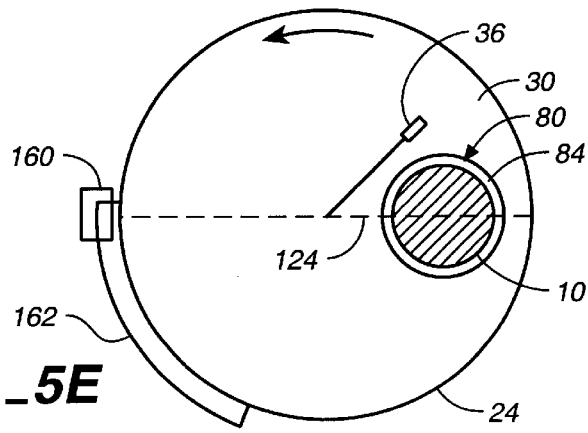
FIG._5E

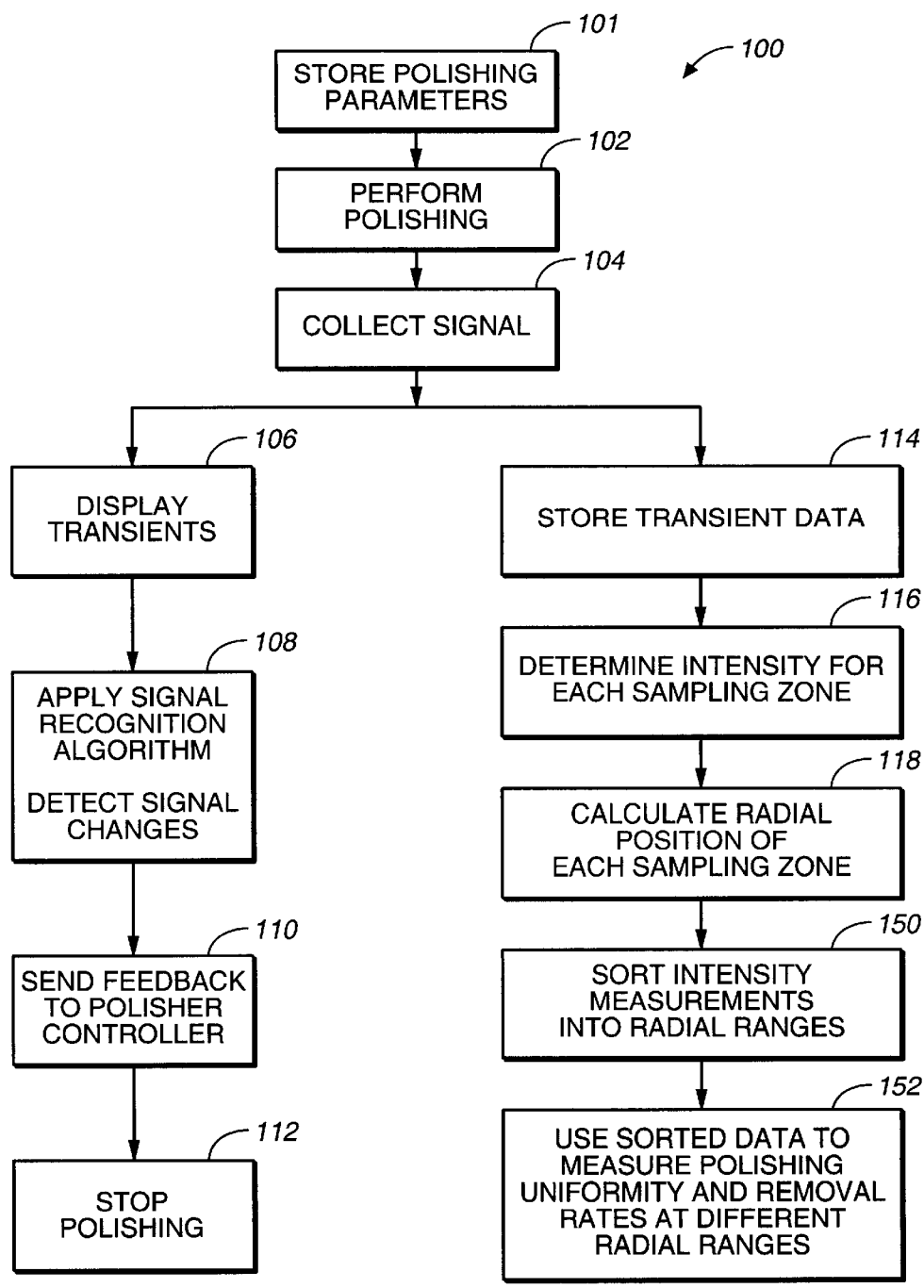
FIG._6

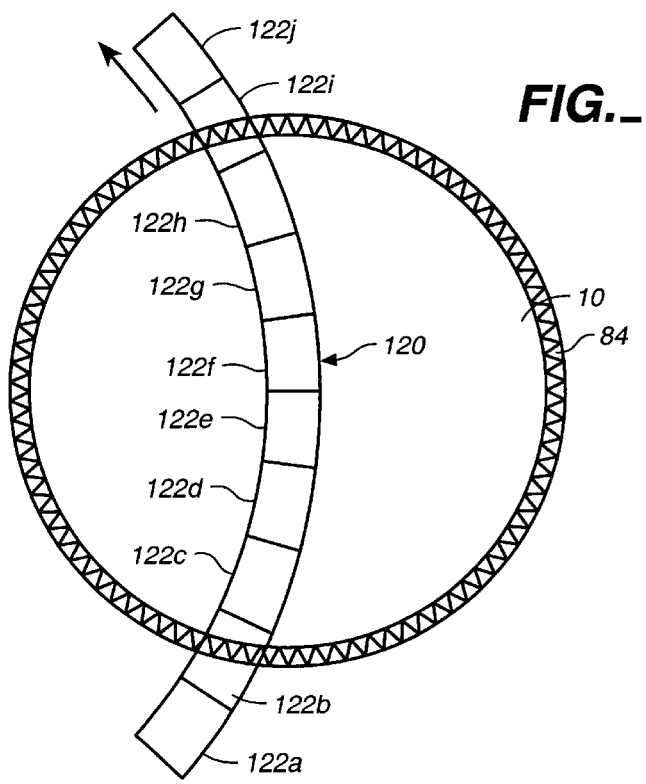
FIG._7A
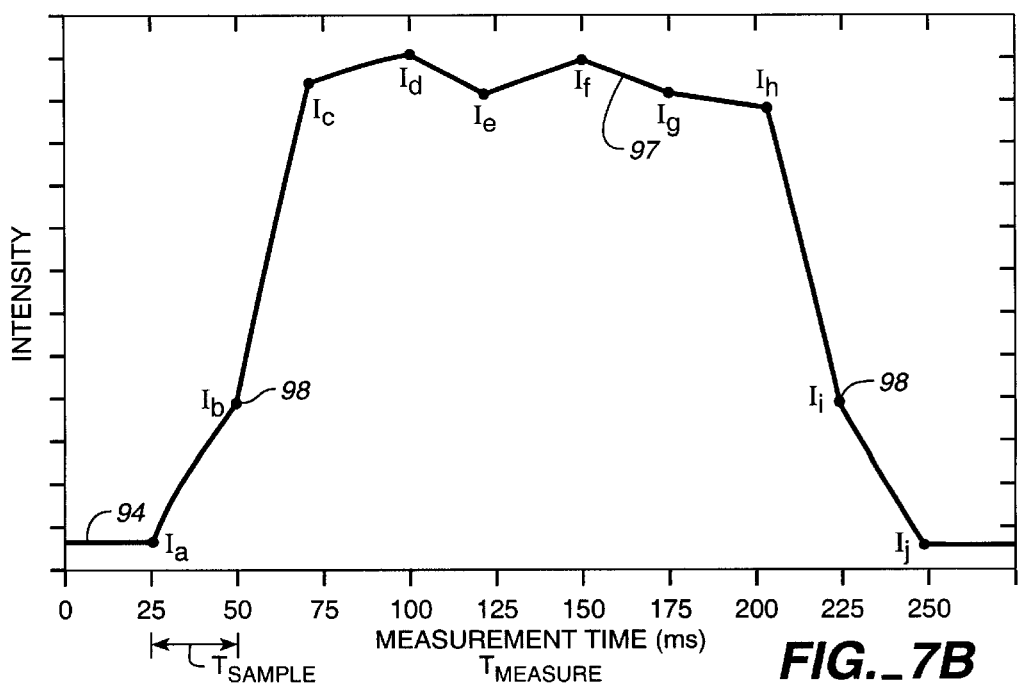
FIG._7B

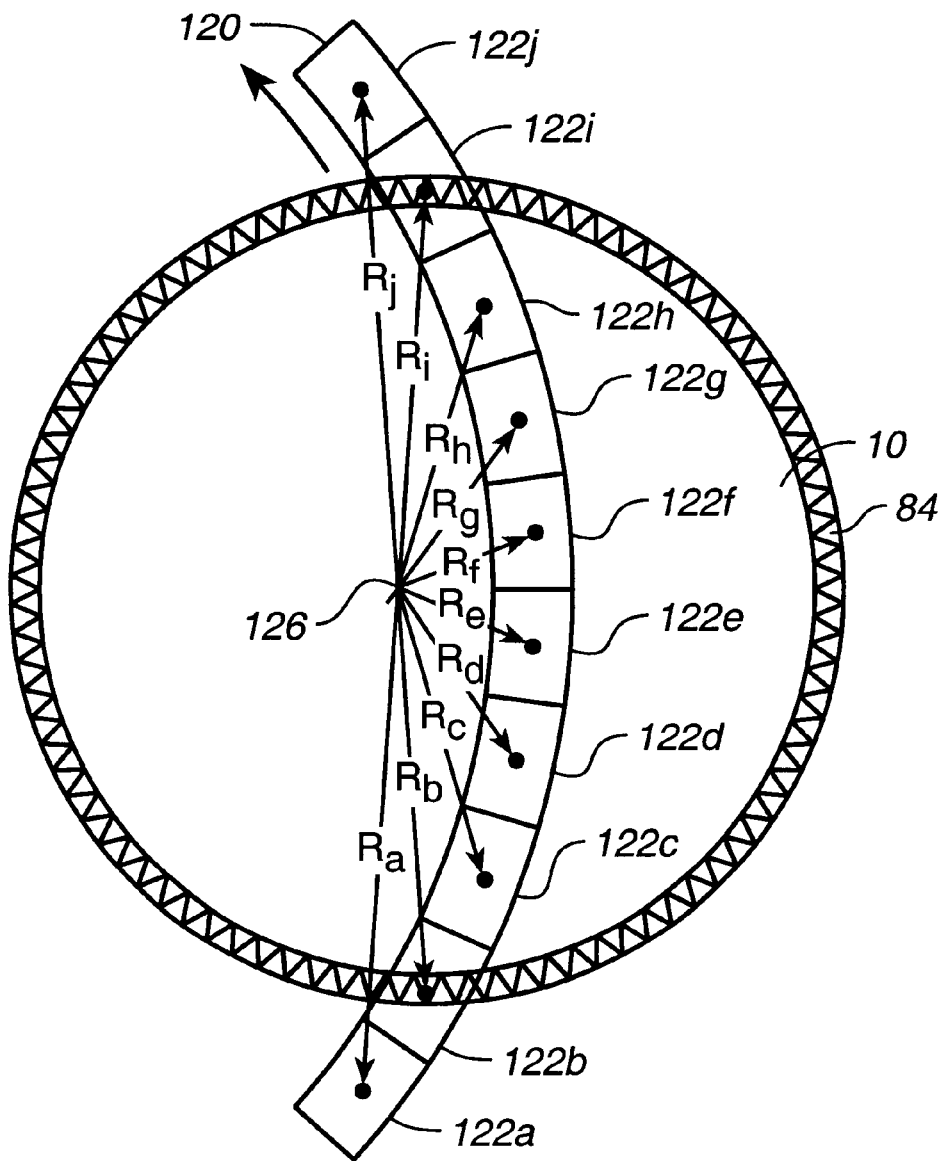
FIG._8

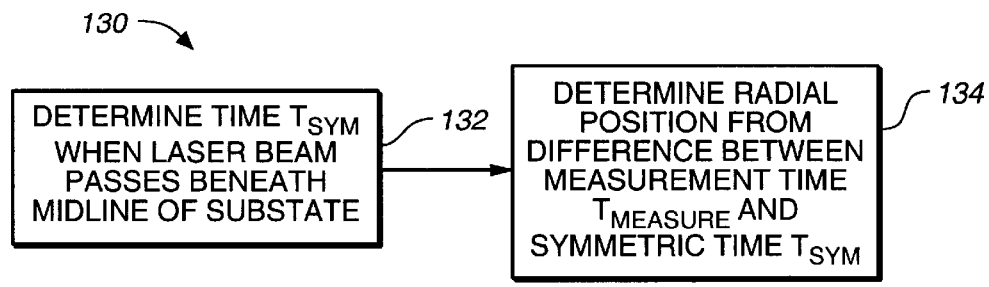
*FIG._9A*
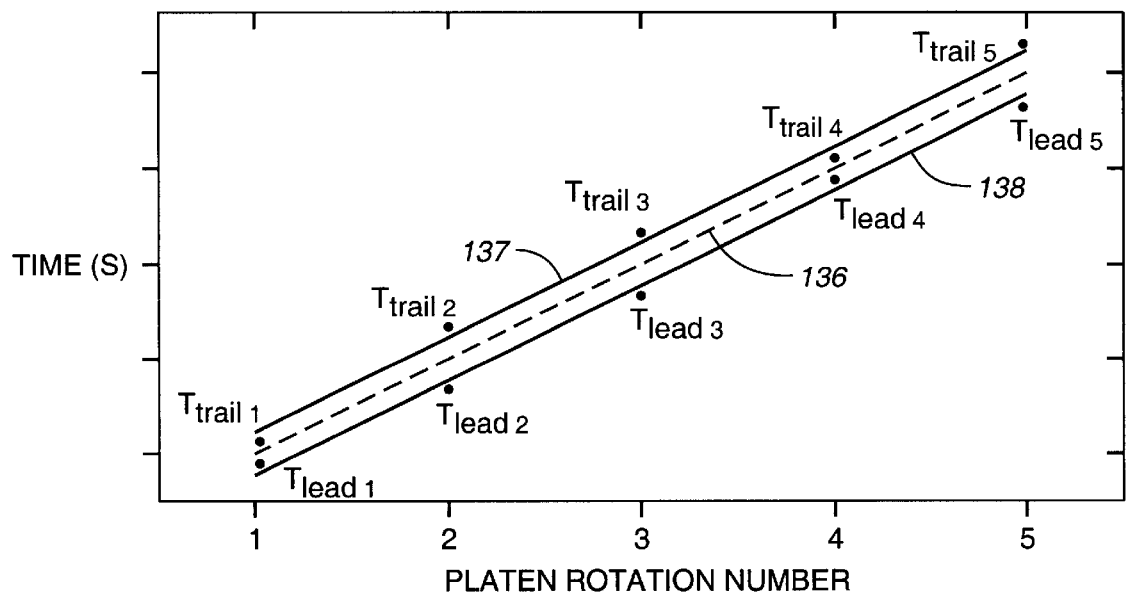
*FIG._9B*

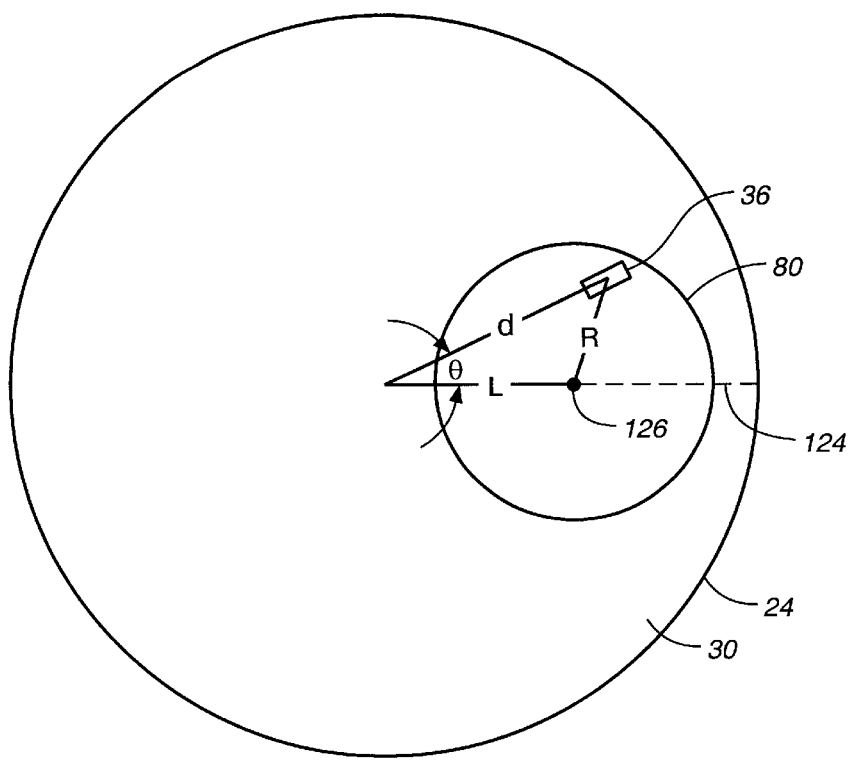
FIG._10
| | | | | | |
|---|---|---|---|---|---|
| Bin 1 | $I_1$ $t_1$ | $I_{15}$ $t_{15}$ | $I_{24}$ $t_{24}$ | . . . . | |
| Bin 2 | $I_2$ $t_2$ | $I_{17}$ $t_{17}$ | $I_{19}$ $t_{19}$ | . . . . | |
| Bin 3 | $I_3$ $t_3$ | $I_{12}$ $t_{12}$ | | | |
| | | | | | |
| | | | | | |
FIG._11

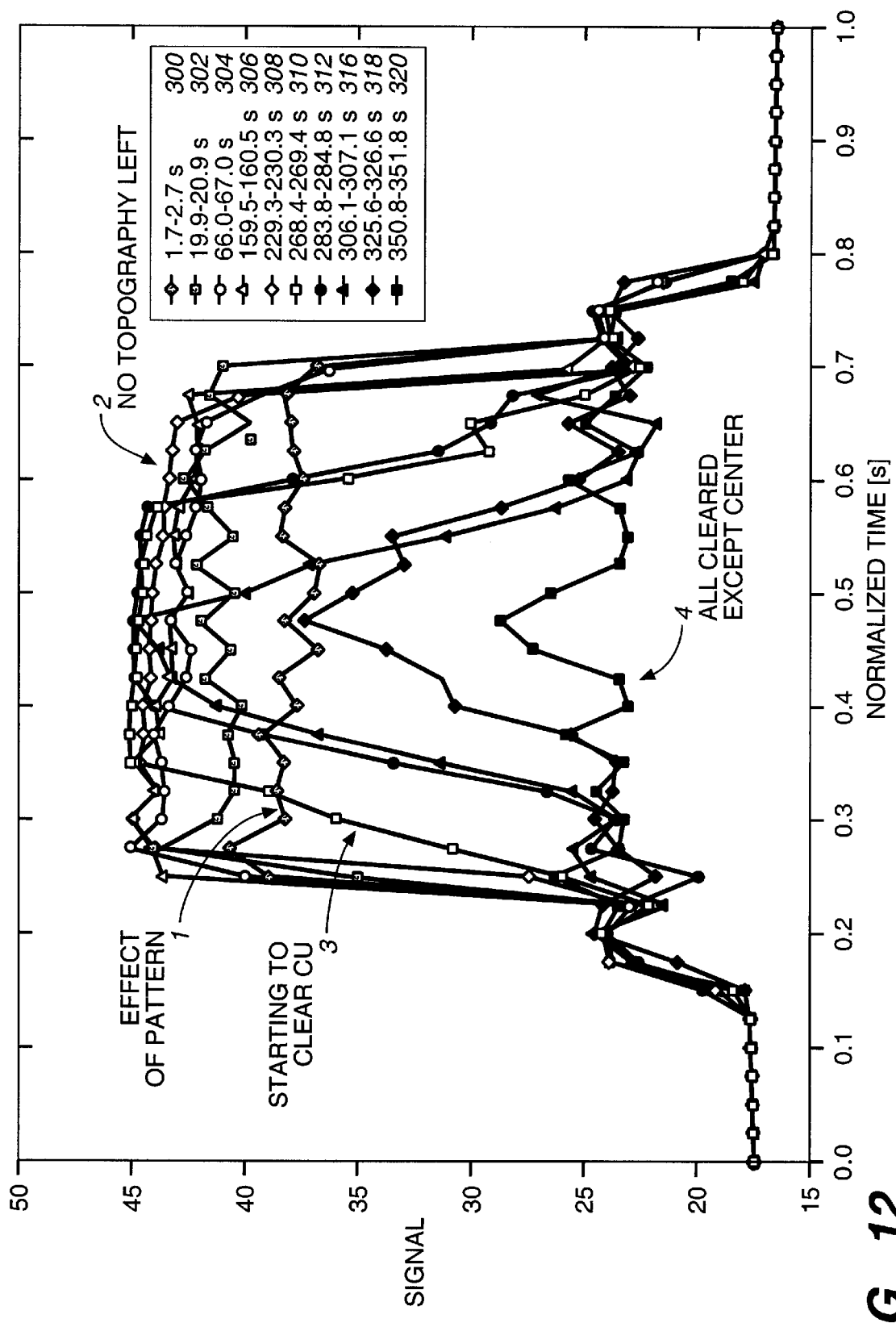
FIG._12

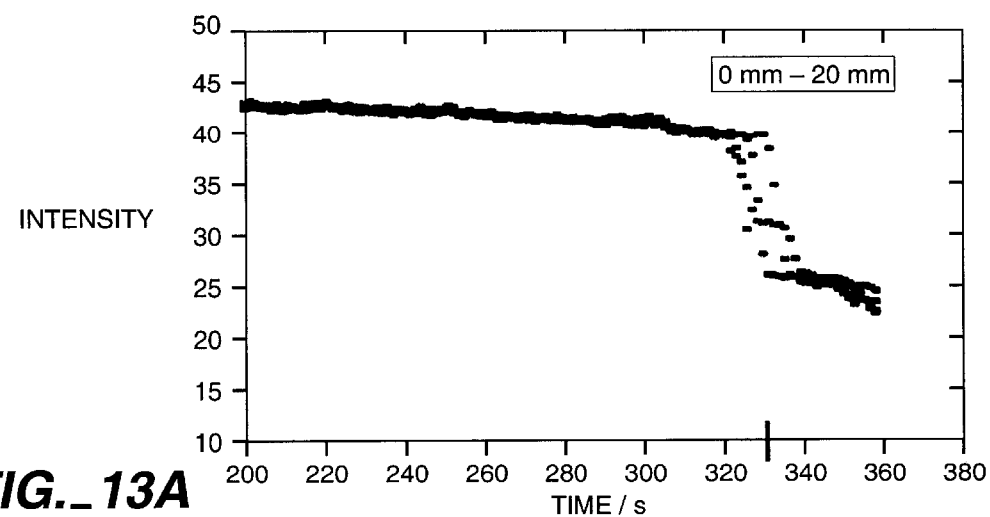
FIG._13A
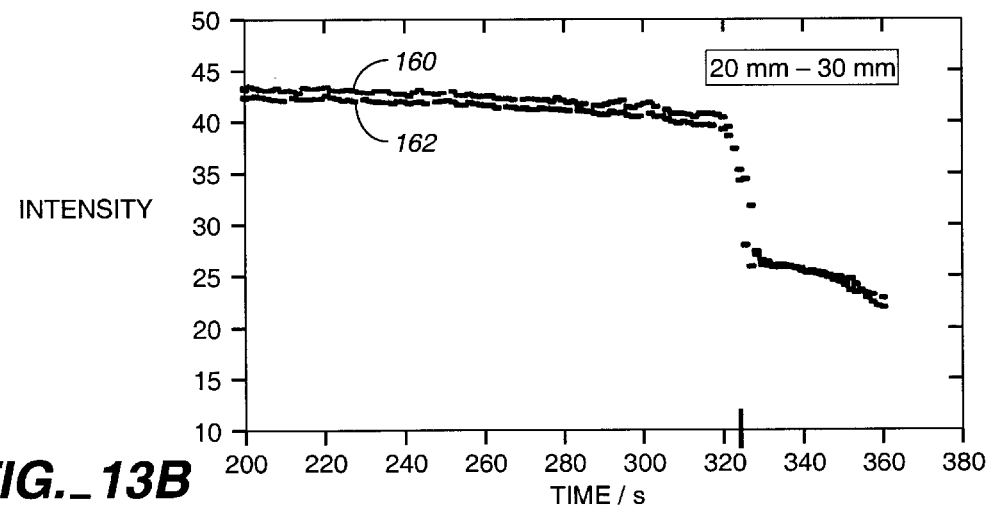
FIG._13B
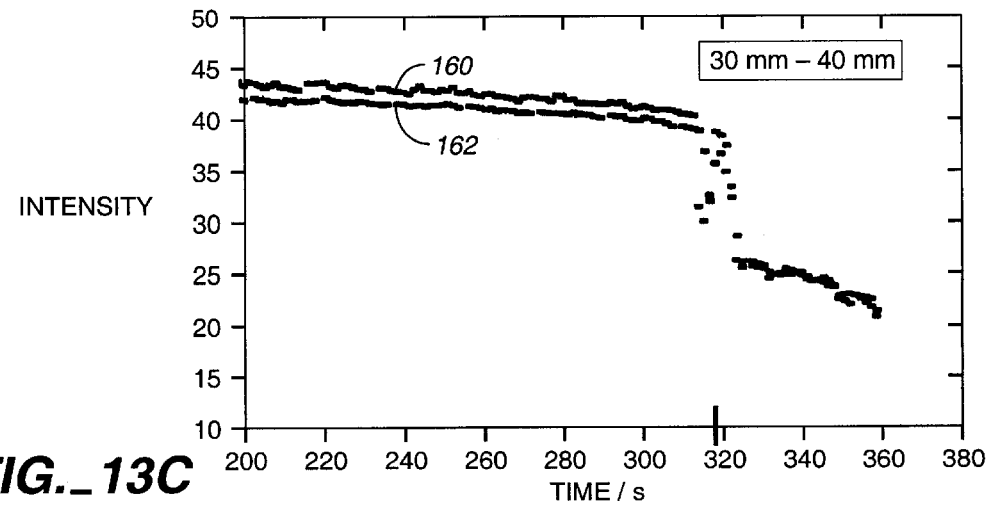
FIG._13C

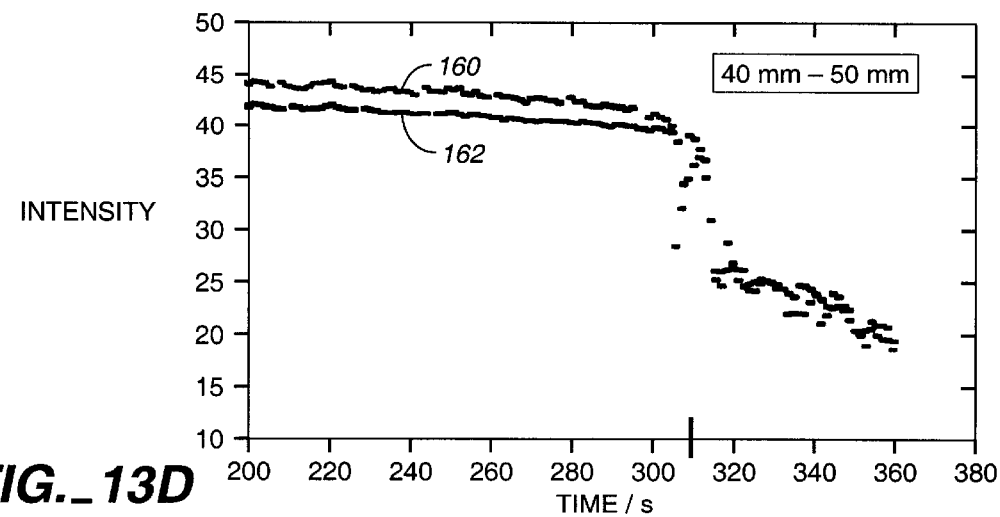
FIG._13D
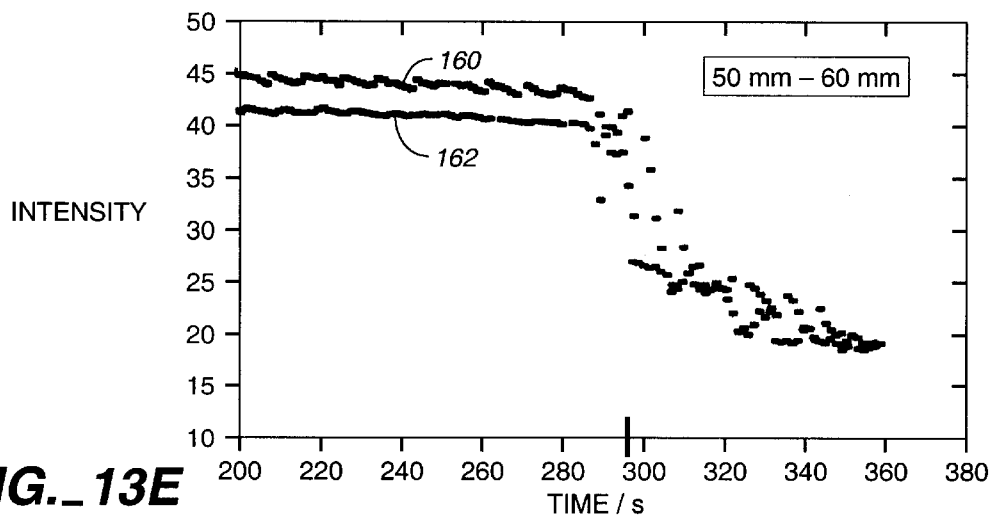
FIG._13E
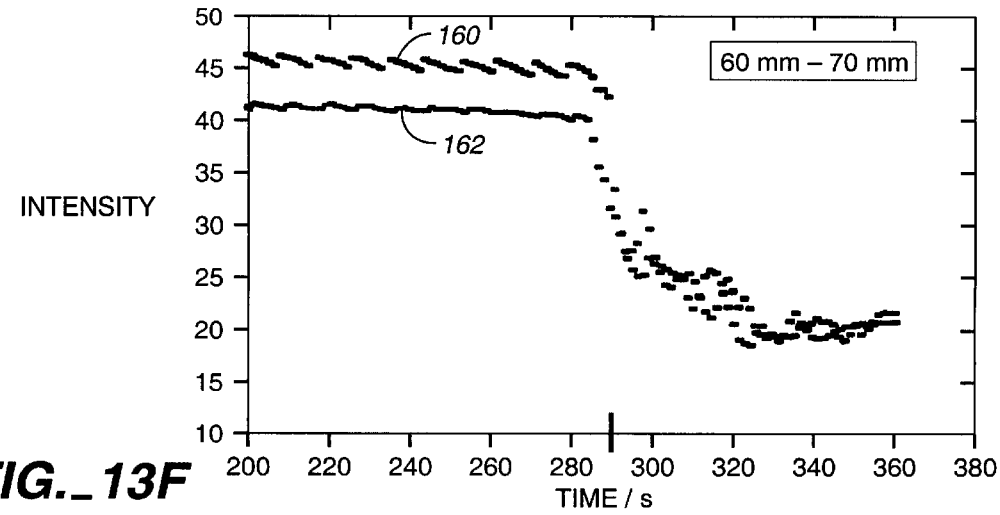
FIG._13F

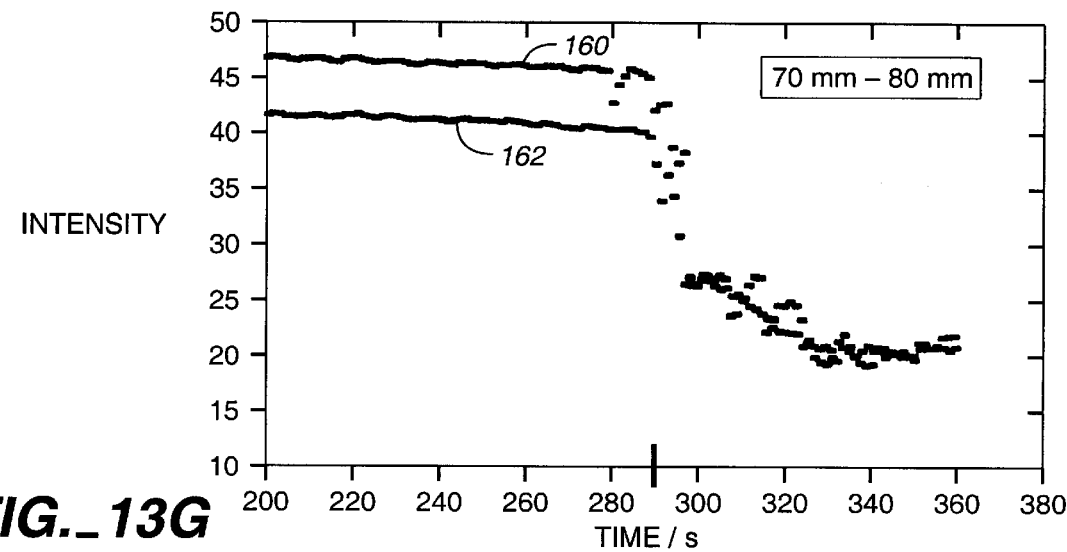
FIG._13G
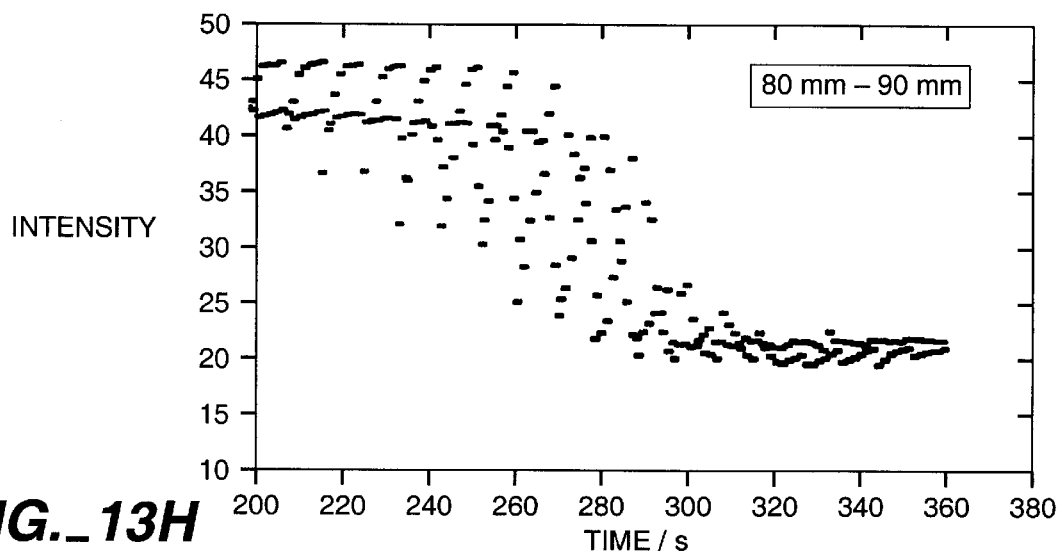
FIG._13H

METHOD AND APPARATUS FOR OPTICAL MONITORING IN CHEMICAL MECHANICAL POLISHING

CROSS-REFERENCE TO RELATED APPLICATIONS

This application is a continuation-in-part of pending U.S. application Ser. No. 09/184,767, filed Nov. 2, 1998. This application also claims priority under 35 USC 119(e) to pending U.S. Provisional Application Serial No. 60/139,015, filed Jun. 14, 1999.

BACKGROUND

The present invention relates generally to chemical mechanical polishing of substrates, and more particularly to methods and apparatus for detecting an end-point of a metal layer during a chemical mechanical polishing operation.

An integrated circuit is typically formed on a substrate by the sequential deposition of conductive, semiconductive or insulative layers on a silicon wafer. After each layer is deposited, the layer is etched to create circuitry features. As a series of layers are sequentially deposited and etched, the outer or uppermost surface of the substrate, i.e., the exposed surface of the substrate, becomes increasingly non-planar. This non-planar surface presents problems in the photolithographic steps of the integrated circuit fabrication process. Therefore, there is a need to periodically planarize the substrate surface.

Chemical mechanical polishing (CMP) is one accepted method of planarization. This planarization method typically requires that the substrate be mounted on a carrier or polishing head. The exposed surface of the substrate is placed against a rotating polishing pad. The polishing pad may be either a "standard" pad or a fixed-abrasive pad. A standard pad has a durable roughened surface, whereas a fixed-abrasive pad has abrasive particles held in a containment media. The carrier head provides a controllable load, i.e., pressure, on the substrate to push it against the polishing pad. A polishing slurry, including at least one chemically-reactive agent, and abrasive particles if a standard pad is used, is supplied to the surface of the polishing pad.

One problem in CMP is determining whether the polishing process is complete, i.e., whether a substrate layer has been planarized to a desired flatness or thickness. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

One way to determine the polishing endpoint is to remove the substrate from the polishing surface and examine it. For example, the substrate may be transferred to a metrology station where the thickness of a substrate layer is measured, e.g., with a profilometer or a resistivity measurement. If the desired specifications are not met, the substrate is reloaded into the CMP apparatus for further processing. This is a time consuming procedure that reduces the throughput of the CMP apparatus. Alternatively, the examination might reveal that an excessive amount of material has been removed, rendering the substrate unusable.

Several methods have been developed for in-situ polishing endpoint detection. Most of these methods involve monitoring a parameter associated with the substrate surface, and indicating an endpoint when the parameter abruptly changes. For example, where an insulative or dielectric layer is being polished to expose an underlying metal layer, the coefficient of friction and the reflectivity of the substrate will change abruptly when the metal layer is exposed.

Where the monitored parameter changes abruptly at the polishing endpoint, such endpoint detection methods are acceptable. However, as the substrate is being polished, the polishing pad condition and the slurry composition at the pad-substrate interface may change. Such changes may mask the exposure of an underlying layer, or they may imitate an endpoint condition. Additionally, such endpoint detection methods will not work if only planarization is being performed, if the underlying layer is to be over-polished, or if the underlying layer and the overlying layer have similar physical properties.

SUMMARY

In one aspect, the invention is directed to a method of determining polishing parameters. In the method, a surface of a substrate is brought into contact with a polishing pad that has a window, relative motion is created between the substrate and the polishing pad, and a light beam is directed through the window. The motion of the polishing pad relative to the substrate causes the light beam to move in a path across the substrate. Light beam reflections from a layer in the substrate are detected, reflection data associated with the light beam reflections is generated, and the reflection data from a scan of the light beam across the substrate is displayed. Polishing parameters are selected to provide uniform polishing of the substrate based on the displayed reflection data.

Implemenations of the invention may include one or more of the following features. The displayed reflection data may show the reflectivity of the substrate as the light beam scans across the substrate. The reflectivity of the substrate may be displayed in real-time during polishing. The layer may be a metal. The reflection data may include a plurality of intensity measurements made at a plurality of positions along the path across the substrate. A radial position relative to the center of the substrate may be calculated for each intensity measurement. The reflection data may be divided into a plurality of radial ranges, and which radial range is the last portion to be completely polished may be determined. The displayed reflection data may form at least one transient signal graph. Each transient signal graph may comprise reflection data from a single sweep of the window beneath the substrate.

In another aspect, the invention is directed to a method of generating endpoint parameters. A first substrate is polished, light beam reflections are detected during polishing the first substrate to generate a first plurality of intensity measurements, and a radial range to use for endpoint detection is determined from the first plurality of intensity measurements. A second substrate is polished, light beam reflections are detected during polishing of a layer in a second substrate to generate a second plurality of intensity measurements, a radial position relative to the center of the substrate is calculated for each of the second intensity measurements, and a polishing endpoint is determined from those second intensity measurements which are within the radial range.

Implementations of the invention may include one or more of the following features. Determining the radial range may include determining the last portion of the substrate to be completely polished. At least one process parameter may be determined for polishing of the second substrate from the first plurality of intensity measurements.

In another aspect, the invention relates to a method of determining process uniformity. In the method, light beam reflections are detected during polishing of a layer in first and second substrates. Reflection data associated with the light beam reflections is generated, and the reflection data is displayed from a first scan of the light beam across the first substrate and from a second scan of the light beam across the second substrate. The reflection data from the first scan is compared to the reflection data from the second scan to determine process uniformity. A polishing consumable may be changed between the polishing of the first and second substrates.

Advantages of the invention include one or more of the following. The reflection data from a wafer is captured using a high resolution data acquisition system at a relatively fine time scale, on the order of milliseconds. Further, reflection intensity changes during polishing are captured for different radial positions on the substrate. The high resolution data acquisition system provides precise time control of each process step in a multi-step operation. Detailed data is available on the progress of the metal polishing operation at different locations of the wafer. Additionally, parameters such as uniformity of the entire wafer and removal rate for different radial portions of the wafer are determined. The acquired high resolution data can be processed on-line or off-line to adjust various variables and parameters to minimize erosion and dishing of the surface layer. If the data is processed in real-time, the feedback data may be used for endpoint detection or for closed-loop control of process parameters. For instance, the polishing pressure, polishing speed, chemistry, and slurry composition may be altered in response to the feedback data to optimize the overall polishing performance and/or polishing quality. The reflection data is available for experimentation to improve the deposition process.

Other features and advantages of the invention will become apparent from the following description, including the drawings and claims.

BRIEF DESCRIPTION OF THE DRAWINGS

FIG. 1 is an exploded perspective view of a chemical mechanical polishing apparatus.

FIG. 2 is a side view of a chemical mechanical polishing apparatus including an optical reflectometer.

FIG. 3 is a simplified cross-sectional view of a substrate being processed, schematically showing a laser beam impinging on and reflecting from the substrate.

FIG. 4 is a graph showing a measured reflectance trace in arbitrary intensity units (a.u.).

FIGS. 5A–5E are simplified plan views illustrating the position of a window in a polishing pad as a platen rotates.

FIG. 6 is a flow chart of a method of determining the end-point of the polishing of a metal layer during CMP.

FIG. 7A is a schematic view illustrating the path of a laser beneath the carrier head.

FIG. 7B is a graph showing a hypothetical portion of a reflectance trace generated by a single sweep of the window beneath the carrier head.

FIG. 8 is a schematic view illustrating the radial positions of sampling zones from the path of the laser.

FIG. 9A is a flow chart of a method of determining the radial position of a sampling zone.

FIG. 9B is a graph showing the time at which the laser beam passes beneath the leading and trailing edges of the substrate as a function of the number of rotations of the platen.

FIG. 10 is a schematic view illustrating the calculation of the radial position of the sampling zones.

FIG. 11 is a schematic diagram of a data structure to store intensity measurements.

FIG. 12 is a graph illustrating an overlay of several reflectance traces taken at different times.

FIGS. 13A–13H are graphs showing the reflected intensity of the metal layer as a function of distance from the center of the substrate over a polishing period.

DETAILED DESCRIPTION

Referring to FIGS. 1 and 2, one or more substrates 10 may be polished by a CMP apparatus 20. A description of a similar polishing apparatus 20 may be found in U.S. Pat. No. 5,738,574, the entire disclosure of which is incorporated herein by reference. Polishing apparatus 20 includes a series of polishing stations 22 and a transfer station 23. Transfer station 23 serves multiple functions, including receiving individual substrates 10 from a loading apparatus (not shown), washing the substrates, loading the substrates into carrier heads, receiving the substrates from the carrier heads, washing the substrates again, and finally, transferring the substrates back to the loading apparatus.

Each polishing station includes a rotatable platen 24 on which is placed a polishing pad 30. The first and second stations may include a two-layer polishing pad with a hard durable outer surface, whereas the final polishing station may include a relatively soft pad. If substrate 10 is an "eight-inch" (200 millimeter) or "twelve-inch" (300 millimeter) diameter disk, then the platens and polishing pads will be about twenty inches or thirty inches in diameter, respectively. Each platen 24 may be connected to a platen drive motor (not shown). For most polishing processes, the platen drive motor rotates platen 24 at about thirty to two hundred revolutions per minute, although lower or higher rotational speeds may be used. Each polishing station may also include a pad conditioner apparatus 28 to maintain the condition of the polishing pad so that it will effectively polish substrates.

Polishing pad 30 typically has a backing layer 32 which abuts the surface of platen 24 and a covering layer 34 which is used to polish substrate 10. Covering layer 34 is typically harder than backing layer 32. However, some pads have only a covering layer and no backing layer. Covering layer 34 may be composed of an open cell foamed polyurethane or a sheet of polyurethane with a grooved surface. Backing layer 32 may be composed of compressed felt fibers leached with urethane. A two-layer polishing pad, with the covering layer composed of IC-1000 and the backing layer composed of SUBA-4, is available from Rodel, Inc., of Newark, Del. (IC-1000 and SUBA-4 are product names of Rodel, Inc.).

A rotatable multi-head carousel 60 is supported by a center post 62 and is rotated thereon about a carousel axis 64 by a carousel motor assembly (not shown). Center post 62 supports a carousel support plate 66 and a cover 68. Carousel 60 includes four carrier head systems 70. Center post 62 allows the carousel motor to rotate carousel support plate 66 and to orbit the carrier head systems and the substrates attached thereto about carousel axis 64. Three of the carrier head systems receive and hold substrates, and polish them by pressing them against the polishing pads. Meanwhile, one of the carrier head systems receives a substrate from and delivers a substrate to transfer station 23.

Each carrier head system includes a carrier or carrier head 80. A carrier drive shaft 74 connects a carrier head rotation motor 76 (shown by the removal of one quarter of cover 68) to each carrier head 80 so that each carrier head can independently rotate about it own axis. There is one carrier drive shaft and motor for each head. In addition, each carrier head 80 independently laterally oscillates in a radial slot 72 formed in carousel support plate 66. A slider (not shown) supports each drive shaft in its associated radial slot. A radial drive motor (not shown) may move the slider to laterally oscillate the carrier head.

The carrier head 80 performs several mechanical functions. Generally, the carrier head holds the substrate against the polishing pad, evenly distributes a downward pressure across the back surface of the substrate, transfers torque from the drive shaft to the substrate, and ensures that the substrate does not slip out from beneath the carrier head during polishing operations.

Carrier head 80 may include a flexible membrane 82 that provides a mounting surface for substrate 10, and a retaining ring 84 to retain the substrate beneath the mounting surface. Pressurization of a chamber 86 defined by flexible membrane 82 forces the substrate against the polishing pad. Retaining ring 84 may be formed of a highly reflective material, or it may be coated with a reflective layer to provide it with a reflective lower surface 88. A description of a similar carrier head 80 may be found in U.S. patent application Ser. No. 08/745,679, entitled a CARRIER HEAD WITH A FLEXIBLE MEMBRANE FOR A CHEMICAL MECHANICAL POLISHING SYSTEM, filed Nov. 8, 1996, by Steven M. Zuniga et al., assigned to the assignee of the present invention, the entire disclosure of which is incorporated herein by reference.

A slurry 38 containing a reactive agent (e.g., deionized water for oxide polishing) and a chemically-reactive catalyzer (e.g., potassium hydroxide for oxide polishing) may be supplied to the surface of polishing pad 30 by a slurry supply port or combined slurry/rinse arm 39. If polishing pad 30 is a standard pad, slurry 38 may also include abrasive particles (e.g., silicon dioxide for oxide polishing).

In operation, the platen is rotated about its central axis 25, and the carrier head is rotated about its central axis 81 and translated laterally across the surface of the polishing pad.

A hole 26 is formed in platen 24 and a transparent window 36 is formed in a portion of polishing pad 30 overlying the hole. Transparent window 36 may be constructed as described in U.S. patent application Ser. No. 08/689,930, entitled METHOD OF FORMING A TRANSPARENT WINDOW IN A POLISHING PAD FOR A CHEMICAL MECHANICAL POLISHING APPARATUS by Manoocher Birang, et al., filed Aug. 26, 1996, and assigned to the assignee of the present invention, the entire disclosure of which is incorporated herein by reference. Hole 26 and transparent window 36 are positioned such that they have a view of substrate 10 during a portion of the platen's rotation, regardless of the translational position of the carrier head.

A reflectometer 40 is secured to platen 24 generally beneath hole 26 and rotates with the platen. The reflectometer includes a light source 44 and a detector 46. The light source generates a light beam 42 which propagates through transparent window 36 and slurry 38 (see FIG. 3) to impinge upon the exposed surface of substrate 10. For example, the light source 44 may be laser and the light beam 42 may be a collimated laser beam. The light laser beam 42 is projected from laser 44 at an angle $\alpha$ from an axis normal to the surface of substrate 10, i.e., at an angle $\alpha$ from axes 25 and 81. In addition, if the hole 26 and window 36 are elongated, a beam expander (not illustrated) may be positioned in the path of the light beam to expand the light beam along the elongated axis of the window. Laser 44 may operate continuously. Alternatively, the laser may be activated to generate laser beam 42 during a time when hole 26 is generally adjacent substrate 10.

Referring to FIGS. 2 and 5A–5E, CMP apparatus 20 may include a position sensor 160, such as an optical interrupter, to sense when window 36 is near the substrate. For example, the optical interrupter could be mounted at a fixed point opposite carrier head 80. A flag 162 is attached to the periphery of the platen. The point of attachment and length of flag 162 is selected so that it interrupts the optical signal of sensor 160 from a time shortly before window 36 sweeps beneath carrier head 80 to a time shortly thereafter. The output signal from detector 46 may be measured and stored while the optical signal of sensor 160 is interrupted.

In operation, CMP apparatus 20 uses reflectometer 40 to determine the amount of material removed from the surface of the substrate, or to determine when the surface has become planarized. A general purpose programmable digital computer 48 may be connected to laser 44, detector 46 and sensor 160. Computer 48 may be programmed to activate the laser when the substrate generally overlies the window, to store intensity measurements from the detector, to display the intensity measurements on an output device 49, to store the intensity measurement, to sort the intensity measurements into radial ranges, and to detect the polishing end-point.

Referring to FIG. 3, a substrate 10 includes a silicon wafer 12 and an overlying metal layer 16 disposed over an oxide or nitride layer 14. The metal may be copper, tungsten, aluminum, among others. As different portions of the substrate with different reflectivities are polished, the signal output from the detector 46 varies with time. Particularly, when the metal layer 16 has been polished away to expose the oxide or nitride layer 14, the reflectivity of the substrate drops. The time varying output of detector 46 may be referred to as an insitu reflectance measurement trace (or more simply, a reflectance trace). As discussed below, this reflectance trace may be used to determine the end-point of the metal layer polishing operation.

Referring to FIGS. 4 and 5A–5E, a measured reflectance trace with a transient intensity waveform 90 generated by polishing a metal-coated wafer is shown. The intensity waveform 90 is generated over a relatively long time scale (measured in seconds). Characteristic features of the waveform include top level plateau 97, each of which is surrounded by left and right intermediate plateau 98. One cycle of the waveform 90 includes left and right intermediate level plateau 98, one of the top level plateau 97, and a background level 94.

The intermediate plateau 98 represent reflections from the retaining ring 84, while the top level plateau 97 represent reflections from the substrate 10. The background level represents scattered reflections from the window and slurry. The reflection from retaining ring 84 is higher than background level. As the substrate 10 is polished and the metal layer 16 is removed to expose the underlying layer 14, the end-point waveform 90 drops toward or below the level of the intermediate plateau 98.

Referring to FIGS. 4 and 5A–5E, the large scale structure of reflectance trace 90 can be explained by reference to the angular position of platen 24. Initially, window 36 does not have view of the substrate (see FIG. 5A). Consequently, laser beam 42 is not reflected and the intensity measured by detector 46 is a result of background intensity, including reflection from slurry 38 and transparent window 36. This low intensity corresponds to the background level 94. As platen 24 rotates, window 36 first sweeps underneath retaining ring 84 of carrier head 80 (see FIG. 5B). The lower surface 88 of retaining ring 84 reflects a portion of laser beam 42 into detector 46, creating an intermediate intensity measurement that corresponds to intermediate plateau 98. As window 36 sweeps beneath substrate 10 (see FIG. 5C) a portion of laser beam 42 is reflected by the substrate. In general, the metal layer of substrate 10 will have a high reflectivity, resulting in top level plateau 97 on reflectance trace 90. As the platen continues to rotate, window 36 passes again beneath retaining ring 84 (see FIG. 5D). Finally, window 36 sweeps out from beneath carrier head 80 (see FIG. 5E), and the detector measures a low intensity that corresponds to the background 94.

Computer 48 of CMP apparatus 20 may use the reflectance trace generated by reflectometer 40 to determine the end-point of the metal layer polishing operation. Each measurement may be performed at a plurality of radial positions. In addition, computer 48 may use the intensity measurements to determine the flatness of the substrate and the polishing uniformity for CMP tool and process qualification as explained below.

Referring now to FIG. 6, an end-point determining process is shown. First, several polishing parameters that will be used during the end-point determination are stored in the memory of computer 48 (step 101). The polishing parameters of interest include the platen rotation rate and the carrier head sweep profile.

A metal layer on a surface of the substrate 12 is polished (step 102) by bringing the surface of the substrate into contact with the polishing pad 30 (FIG. 2). The polishing pad 30 is rotated, causing relative motion between the substrate and the polishing pad.

Transient intensity data is monitored and collected for a plurality of sampling zones (step 104). This is done by directing a light beam generated by the reflectometer 40 through the window. The motion of the polishing pad 30 relative to the substrate 12 causes the light beam to move in a path across the substrate surface. Light beam reflections from the substrate 10 and the retaining ring 84 are detected by a sensor, which generates reflection data associated with the light beam reflections.

The transient intensity data is displayed on a monitor (step 106) for an operator to monitor the progress of the polishing operation. A pattern recognizer is applied to the transient intensity data to detect signal changes (step 108). The pattern recognizer may simply be a threshold detector which checks whether the intensity data has fallen below a predetermined threshold. Alternatively, in another embodiment, a window logic can be applied to the data to detect a sequence of signal changes. Three types of window logic are used to detect local maxima and minima: a window logic with a downwardly cusp to detect a downward trend in the reflection data; a window logic with an upwardly cusp to detect an upward trend in the reflection data; and a window logic with a substantially flat line to detect that the reflection data is relatively static. The signal changes may be averaged. More discussion of pattern recognition algorithms for endpoint detection may be found in above mentioned U.S. patent application Ser. No. 08/689,930.

The output of the pattern recognizer is a stop signal which, along with additional feedback data, is provided to a polisher controller (step 110). The polisher controller uses the feedback data to adjust various variables and parameters to minimize erosion and dishing of the surface layer. For instance, the polishing pressure, polishing speed, chemistry, and slurry composition may be deployed to optimize the overall polishing performance and/or polishing quality. The stop signal causes the polisher controller to stop the current metal layer polishing operation (step 112).

Concurrent with steps 106–112, the process of FIG. 6 stores the transient intensity data onto a data storage device, e.g., a computer disk (step 114) for subsequent processing. In brief, the intensity for each sampling zone is determined (step 116), the radial position of each sampling zone is calculated (step 118), and the intensity measurements are sorted into radial ranges (step 150). The sorted intensity measurements are used to measure the polishing uniformity and removal rates at different radial ranges of the substrate (step 152). Each of these steps will be discussed in greater detail below.

Generally, the reflected intensity changes during polishing for different radial positions on the substrate. The metal layer may be removed at different rates for different portions of the substrate. For instance, the metal layer near the center of the substrate may be removed last, while the metal layer near the perimeter or edge of the substrate may be removed first, or vice versa. The reflection data from the entire wafer is captured at a relatively fine time scale in the order of milliseconds and is available for experimentation to improve the deposition process. By analyzing the recorded data, the process can be changed to make it faster, shorter or smoother. As can be appreciated, the stored data is useful for process research and development to optimize the process performance.

Referring to FIGS. 7A and 7B, the combined rotation of the platen and the linear sweep of the carrier head causes window 36 (and thus laser beam 42) to sweep across the bottom surface of carrier head 80 and substrate 10 in a sweep path 120. As the laser beam sweeps across the substrate, reflectometer 40 integrates the measured intensity over a sampling period, $T_{sample}$, to generate a series of individual intensity measurements $I_a, I_b, \ldots I_j$. The sample rate F (the rate at which intensity measurements are generated) of reflectometer 40 is given by $F=1/T_{sample}$. Reflectometer 40 may have a sample rate between about 10 and 400 Hertz (Hz), corresponding to a sampling period between about 2.5 and 100 milliseconds. Specifically, reflectometer 40 may have a sampling rate of about 40 Hz and a sampling period of about 25 milliseconds.

Thus, each time that laser 44 is activated, reflectometer 40 measures the intensity from a plurality of sampling zones 122a–122j. Each sampling zone corresponds to the area of the substrate over which the laser beam sweeps during a corresponding sampling period. In summary, in step 106, reflectometer 40 generates a series of intensity measurements Ia, Ib, . . . Ij corresponding to sampling zones 122a, 122b, . . . , 122j.

Although FIG. 7A illustrates ten sampling zones, there could be more or fewer zones, depending on the platen rotation rate and the sampling rate. Specifically, a lower sampling rate will result in fewer, wider sampling zones, whereas a higher sampling rate will result in a greater number of narrower sampling zones. Similarly, a lower rotation rate will result in a larger number of narrower sampling zones, whereas a higher rotation rate will result in a lower number of wider sampling zones. In addition, multiple detectors could be used to provide more sampling zones.

As shown in FIG. 7B, the intensity measurements Ia and Ij for sampling zones 122a and 122j, respectively, are low because window 36 does not have a view of the carrier head, and consequently laser beam 42 is not reflected. Sampling zones 122b and 122i are located beneath retaining ring 84, and therefore intensity measurements Ib and Ii will be of intermediate intensity. Sampling zones 122c, 122d, ... 122h are located beneath the substrate, and consequently generate relatively large intensity measurements $I_c$, $I_d$, ... $I_h$ at a variety of different radial positions across the substrate.

FIG. 12 is an overlay of several transient signal graphs 300–320. Each of the transient signal graphs 300–320 represents intensity data over an interval associated with a sweep of the window beneath the carrier head. For instance, the graph 300 shows the end-point data between about 1.7 seconds to about 2.7 seconds, and the graph 320 shows the end-point data between about 350.8 seconds and about 351.8 seconds. Of course, the transient signal graphs can be stored in computer 48 for later reference.

FIG. 12 shows how the endpoint reflected intensity signal changes during the polishing operation. Initially, in period 300, the metal layer on the surface of the substrate 10 is jagged. The metal layer 16 has some initial topography because of the topology of the underlying patterned layer 14. Due to this topography, the light beam scatters when it impinges the metal layer. As the polishing operation progresses, the metal layer becomes more planar and the reflectivity of the polished metal layer increases during periods 302–308. As such, the signal strength steadily increases to a stable level. From period 310–320, as the metal layer 16 is increasingly cleared to expose the oxide layer 14, the overall signal strength declines until the polishing operation is completed. Thus, in period 320, only a small trace of metal remains in the center of the substrate 10.

When entire surface of the substrate is covered with a metal layer, such as copper, the reflection from the substrate 10 has a square profile. As the metal layer is removed from the edge of the substrate 10, the profile of the reflection from the substrate takes on a trapezoidal shape. Eventually, when the metal layer is nearly removed by the polishing operation, the profile of the reflection from the substrate 10 takes on a triangular shape.

The transient signal graphs 300–320 can be viewed by the operator on the display 49 either during or after the polishing operation. The operator can use the displayed transient signal graphs for a variety of diagnostic and process control decisions (which may be applicable to both reflectivity measurements in metal polishing and interference measurements in oxide polishing). The transient signal graphs can be used to select process parameters in order to optimize polishing uniformity. For example, a test wafer can be polished when initially selecting process parameters, such as the plate rotation rate, carrier head pressure, carrier head rotation rate, carrier head sweep profile, and slurry composition. High reflectivity areas represent regions where metal remains on the substrate, and low reflectivity area represent regions where metal has been removed from the substrate. A noisy transient signal graph indicates that the metal has not been evenly removed from the substrate, whereas a relatively flat transient signal graph indicates uniform polishing. Consequently, the operator can draw immediate conclusions, without resorting to measuring the substrate layer thickness with a metrology tool, regarding the effectiveness of the selected process parameters. The operator can then adjust the polishing parameters, polish another test wafer, and determine whether the new polishing parameters have improved the polishing uniformity.

An operator may also examine the transient signal graphs to determine whether the substrate has been polished to planarity, and whether polishing should be halted. Furthermore, if an operator notes during polishing of an actual device wafer that a portion of the substrate is being polished too slowly or too quickly, the process parameters can be changed while polishing is in progress to adjust the polishing rate profile.

The transient signal graphs can also be used as a measure of process repeatability. For example, if the transient signal graphs depart significantly from their expected shapes, this indicates that there is some problem in the polishing machine or process.

In addition, the transient signal graphs can be used to "qualify" a process. Specifically, when the polishing machine receives a new set of consumables, e.g., if the polishing pad or slurry is replaced, the operator may wish to verify that the polishing uniformity has not been affected. An operator can compare the transient signal graphs for the substrates polished before and after the change in consumables to determine whether the polishing uniformity has been affected.

Turning now to FIG. 8, in step 108 the radial positions $R_a$, $R_b$, ... $R_j$ of the corresponding sampling zones 122a, 122b, ... 122j are determined. One way to determine the radial position of a sampling zone is to calculate the position of the laser beneath the substrate based on the measurement time $T_{measure}$ and the platen rotation rate and carrier head sweep profile. Unfortunately, the actual platen rotation rate and carrier head sweep profile may not precisely match the polishing parameters. Therefore, a preferred method 130 of determining the radial positions of the sampling zones is shown in FIG. 9A. First, the time $T_{sym}$ at which laser beam 42 passes beneath a mid-line 124 (see FIG. 5C) of the substrate is determined (step 132). Then the radial positions of the sampling zones are determined from the time difference between the measurement time Tmeasure and the symmetric time $T_{sym}$ (step 134).

One method of determining the symmetry time $T_{sym}$ is to average the times of the first and last large intensity measurements from each sweep, as these intensity measurements should correspond to the substrate edge. However, this results in some uncertainty in $T_{sym}$ because the position of the sampling zones beneath the substrate are not known.

Referring to FIG. 9B, in order to compute the symmetric time $T_{sym}$ in step 132, computer 48 determines the first and last large intensity measurements from sweep path 120, i.e., intensity measurements $I_c$ and $I_h$, and stores the corresponding measurement times $T_{lead}$ and $T_{trail}$. These lead and trail times $T_{lead}$ and $T_{trail}$ are accumulated on each sweep to generate a series of lead times $T_{lead1}$, $T_{lead2}$, ... $T_{leadN}$ and trail times $T_{trail1}$, $T_{trail2}$, ... $T_{trailN}$. Computer 48 stores lead times $T_{lead1}$, $T_{lead2}$, ... $T_{leadN}$ and the associate number of platen rotations 1, 2, ... N for each leading spike 96. Similarly, computer 48 stores the trail times $T_{trail1}$, $T_{trail2}$, ... $T_{trialN}$ and the associated number of rotations 1, 2, ... N of each trailing spike 98. Assuming that platen 24 rotates at a substantially constant rate, the times $T_{lead1}$, $T_{lead2}$, ... $T_{leadN}$ form a substantially linear increasing function (shown by line 136). Similarly, the times $T_{trail1}$, $T_{trail2}$, ... $T_{trailN}$ also form a substantially linear increasing function (shown by line 137). Computer 48 performs two least square fits to generate two linear functions $T_{lead(n)}$ and $T_{trail(n)}$ as follows:

$T_{lead(n)} = a1 + (a2*n)$ $T_{trail(n)} = a3 + (a4*n)$ where n is the number of platen rotations and a1, a2, a3 and a4 are fitting coefficients calculated during the least square fit. Once the fitting coefficients have been calculated, the symmetry time $T_{sym}$ at which laser beam 42 crosses mid-line 124 (shown by phantom line 138) may be calculated as follows:

$$T_{sym} = \left(\frac{a_1 + a_3}{2} + \frac{a_2 + a_4}{2}\right) n$$

By using a least square fit over several platen rotations to calculate the symmetry time $T_{sym}$, uncertainty caused by the differences in the relative position of the sampling zone beneath the retaining ring are substantially reduced, thereby significantly reducing uncertainty in the symmetry time $T_{sym}$.

Once computer 48 has calculated the time $T_{sym}$ at which laser beam 42 crosses midline 124, the radial distance $R_a$, $R_b$, ... $R_j$ of each sampling zone 122a, 122b, ... 122j from the center 126 of the substrate are calculated in step 132. Referring to FIG. 10, the radial position may be calculated as follows:

$$R = \sqrt{d^2 + L^2 - 2dL\cos\theta}$$

where d is the distance between the center of the polishing pad and the center of window 36, L is the distance from the center of the polishing pad to the center of substrate 10, and θ is the angular position of the window. The angular position θ of the window may be calculated as follows:

$$\theta = f_{platen} \cdot 2\pi (T_{measure} - T_{sym})$$

where $f_{platen}$ is the rotational rate of the platen (in rpm). Assuming that the carrier head moves in a sinusoidal pattern, the linear position L of the carrier head may be calculated as follows:

$$L = L_0 + A \cdot (\omega T_{measure})$$

where ω is the sweep frequency, A is the amplitude of the sweep, and $L_O$ is the center position of the carrier sweep.

In another embodiment, position sensor 160 could be used to calculate the time Tsym when the window crosses midline 124. Assuming that sensor 160 is positioned opposite carrier head 80, flag 162 would be positioned symmetrically across from transparent window 36. The computer 48 stores both the trigger time $T_{start}$, when the flag interrupts optical beam of the sensor, and the trigger time $T_{end}$ when the flag clears the optical beam. The time $T_{sym}$ may be calculated as the average of $T_{start}$ and $T_{end}$. In yet another embodiment, the platen and carrier head positions could be determined at each sample time $T_a$, $T_b$, ... $T_h$, from optical encoders connected to the platen drive motor and radial drive motor, respectively.

Once the radial positions $R_a$, $R_b$, ... $R_m$ of the sampling zones have been calculated, some of the intensity measurement may be disregarded. If the radial position R of a sampling zone is greater than the radius of the substrate, then the intensity measurement for that sampling zone includes mostly radiation reflected by the retaining ring or background reflection from the window or slurry. Therefore, the intensity measurements for any sampling zone that is mostly beneath the retaining ring is ignored. This ensures that spurious intensity measurements are not used in the calculation of the thin film layer reflected intensity.

After several sweeps of laser beam 42 beneath the substrate, computer 48 accumulates a set of intensity measurements $I_1, I_2, \ldots I_N$, each associated with a measurement time $T_1, T_2, \ldots T_N$, and a radial position $R_1, R_2, \ldots R_N$.

Referring to FIG. 11, as the intensity, time, and radial position measurements are accumulated in steps 106 and 108, the time and intensity measurements are sorted into bins in a data structure 140 in step 110. Each bin is associated with a radial range of sampling zones. For example, intensity measurements for sampling zones located up to 20 mm from the center of the substrate may be placed in a first bin 142 (see FIG. 13A) which is discussed below, intensity measurements made for sampling zones located between 20 and 30 mm from the center of the substrate may be placed in a second bin 144 (see FIG. 13B), intensity measurements made for sampling zones located between 30 and 40 mm from the center of the substrate may be placed in a third bin 146 (see FIG. 13C), and so on. The exact number of bins and the radial ranges of the bins depend upon the information that the user desires to extract. In general, the radial range of each bin may be selected so that a sufficient number of intensity measurements are accumulated in the bin to provide visually meaningful information.

The calculations discussed above are performed for each bin, thereby providing reflected intensity measurements at a plurality of radial positions across the surface of the substrate. Graphs of the initial and final reflected intensity of the thin film layer as a function of radius are shown in FIGS. 12 discussed above as well as in FIGS. 13A–13H.

Turning now to FIGS. 13A–13H, a number of traces which display how reflected intensity changes during polishing for different radial positions on the substrate 10 are shown. The charts of FIGS. 13A–13H illustrate that the metal layer is removed at different rates for different portions of the substrate. Generally, FIGS. 13A–13H show that the metal layer near the center of the substrate is removed last, while the metal layer near the perimeter or edge of the substrate is cleared first. For example, FIG. 13A shows that the metal layer within a radius range of 0–20 mm is removed at about 330 seconds. FIG. 13B shows that the metal layer within a radius range of 20–30 mm is removed at about 325 seconds. FIG. 13C shows that the metal layer within a radius range of 30–40 mm is removed at about 318 seconds. FIG. 13D shows that the metal layer within a radius range of 40–50 mm is removed at about 310 seconds. FIG. 13E shows that the metal layer within a radius range of 50–60 mm is removed at about 295 seconds. FIG. 13F shows that the metal layer within a radius range of 60–70 mm is removed at about 290 seconds. FIG. 13G shows that the metal layer within a radius range of 70–80 mm is removed at about 290 seconds; and FIG. 13H shows that the metal layer within a radius range of 80–90 mm is removed as early as about 260 seconds.

As shown therein, the reflectance trace for several of the radial ranges exhibit two intensity levels (shown by lines 160 and 162). The distance between the two intensity levels increases with substrate radius. Without being limited to any particular theory, the two intensity levels may be caused by non-symmetric distribution of the slurry or the product of the reaction of the slurry and the metal layer on the substrate. Specifically, on each sweep of the laser beam across the substrate, two data points are usually entered in a bin: one data point which is closer to the leading edge of the substrate and one data point which is closer to the trailing edge of the substrate. However, due to non-symmetric distribution of the slurry and the reaction products beneath the substrate, the laser beam may be more attenuated when passing through slurry layer adjacent different regions of the substrate. Thus, the reflectance traces might also be used as a measure of the uniformity of slurry distribution beneath the substrate.

In another implementation, an operator might decide to use only a single bin. In this case, all of the intensity measurements for the specified radial range are used to determine a single intensity trace, which is used for determination of a polishing endpoint in the conventional fashion. The operator can specify this radial range based on examination of the transient signal graphs. For example, if the transient signal graphs show that the center of the substrate is the last portion to be polished, then the operator can select a radial range around the substrate center to ensure that the endpoint is not triggered until all of the metal has been polished away.

The reflection intensity changes during polishing are thus captured for different radial positions on the substrate. The high resolution data acquisition allows a precise time control of each process step in a multi-step operation. A wealth of parameters such as uniformity of the entire wafer and removal rate for different radial portions of the wafer are captured. The acquired high resolution data can be processed on-line or off-line to adjust various variables and parameters to minimize erosion and dishing of the surface layer. If the data is processed in real-time, the real-time feedback data allows a tighter closed-loop control with the process parameters. Further, the reflection data is available for process engineers to experiment with their processing parameters to improve the polishing process.

The present invention has been described in terms of a preferred embodiment. The invention, however, is not limited to the embodiment depicted and described. Rather, the scope of the invention is defined by the appended claims.

What is claimed is:

1. A method of determining polishing parameters, comprising:

bringing a surface of a substrate into contact with a polishing pad that has a window;

causing relative motion between the substrate and the polishing pad;

directing a light beam through the window, the motion of the polishing pad relative to the substrate causing the light beam to move in a path across the substrate;

detecting light beam reflections from a layer in the substrate;

generating reflection data associated with the light beam reflections;

displaying the reflection data from a scan of the light beam across the substrate; and selecting polishing parameters to provide uniform polishing of the substrate based on the displayed reflection data.

2. The method of claim 1, wherein the displayed reflection data shows the reflectivity of the substrate as the light beam scans across the substrate.

3. The method of claim 1, wherein the reflectivity of the substrate as is displayed in real-time during polishing.

4. The method of claim 3, wherein the layer is a metal.

5. The method of claim 1, wherein the reflection data includes a plurality of intensity measurements made at a plurality of positions along the path across the substrate.

6. The method of claim 5, further comprising calculating a radial position relative to the center of the substrate for each intensity measurement.

7. The method of claim 1, further comprising dividing the reflection data into a plurality of radial ranges, and determining which radial range is the last portion to be completely polished.

8. The method of claim 1, wherein the displayed reflection data forms at least one transient signal graph.

9. The method of claim 8, wherein each transient signal graph consists of reflection data from a single sweep of the window beneath the substrate.

10. The method of claim 9, wherein the layer is a metal.

11. A method of generating endpoint parameters, comprising:

polishing a first substrate;

detecting light beam reflections during polishing the first substrate to generate a first plurality of intensity measurements;

determining a radial range to use for endpoint detection from the first plurality of intensity measurements;

polishing a second substrate;

detecting light beam reflections during polishing of a layer in the second substrate to generate a second plurality of intensity measurements;

calculating a radial position relative to the center of the second substrate for each of the second intensity measurements;

determining a polishing endpoint from those second intensity measurements which are within the radial range.

12. The method of claim 11, wherein determining the radial range includes determining the last portion of the first substrate to be completely polished.

13. The method of claim 11, further comprising determining at least one process parameter for polishing of the second substrate from the first plurality of intensity measurements.

14. A method of determining process uniformity, comprising:

detecting light beam reflections during polishing of a layer in a first substrate;

detecting light beam reflections during polishing of a layer in a second substrate;

generating reflection data associated with the light beam reflections;

displaying reflection data from a first scan of the light beam across the first substrate;

displaying reflection data from a second scan of the light beam across the second substrate; and comparing the reflection data from the first scan to the reflection data from the second scan to determine process uniformity.

15. The method of claim 14, further comprising changing a polishing consumable between the polishing of the first and second substrates.

* * * * *